United States Patent [19]
Choi et al.

[11] Patent Number: 5,696,387
[45] Date of Patent: Dec. 9, 1997

[54] THIN FILM TRANSISTOR IN A LIQUID CRYSTAL DISPLAY HAVING A MICROCRYSTALLINE AND AMORPHOUS ACTIVE LAYERS WITH AN INTRINSIC SEMICONDUCTOR LAYER ATTACHED TO SAME

[75] Inventors: Joon-hoo Choi; Geun-ha Jang, both of Kyounggi-do, Rep. of Korea

[73] Assignee: Samsung Electronics Co., Ltd., Suwon, Rep. of Korea

[21] Appl. No.: 654,270

[22] Filed: May 28, 1996

[30] Foreign Application Priority Data

Aug. 25, 1995 [KR] Rep. of Korea .................. 95-26632

[51] Int. Cl.$^6$ .................. H01L 29/04; H01L 31/036
[52] U.S. Cl. .................. 257/57; 257/49; 257/59; 257/66; 257/72; 349/41; 349/42
[58] Field of Search .................. 257/66, 49, 72, 257/57, 59; 349/41, 42

[56] References Cited

U.S. PATENT DOCUMENTS 5,326,712  7/1994  Bal .................................. 437/40

*Primary Examiner*—Wael Fahmy
*Assistant Examiner*—Fetsum Abraham
*Attorney, Agent, or Firm*—Cushman Darby & Cushman, IP Group of Pillsbury Madison & Sutro LLP

[57] ABSTRACT

A thin film transistor liquid crystal display exhibits a high field effect mobility to permit a high on-current while maintaining a lower off-current. The LCD-TFT has both a microcrystallized silicon layer and an amorphous silicon layer which together serve as a channel layer. An extrinsic semiconductor layer is formed to be in contact with both the microcrystallized silicon layer and the amorphous silicon layer and source and drain electrodes are formed on the extrinsic semiconductor layer.

7 Claims, 3 Drawing Sheets

THIN FILM TRANSISTOR IN A LIQUID CRYSTAL DISPLAY HAVING A MICROCRYSTALLINE AND AMORPHOUS ACTIVE LAYERS WITH AN INTRINSIC SEMICONDUCTOR LAYER ATTACHED TO SAME

BACKGROUND OF THE INVENTION

1. Field of the Invention

The present invention relates in general to a thin film transistor liquid crystal display (TFT-LCD) and a method for manufacturing the same, and more particularly to a TFT-LCD which has high field effect mobility to permit high on-current yet maintain lower off-current.

2. Description of the Related Art

A typical liquid crystal display (LCD) includes a thin film transistor (TFT) substrate, a color filter substrate and a liquid crystal sealed between these substrates.

The TFT substrate has a plurality of pixel electrodes each adjoined by a TFT on its inside. Gate and data lines are arrayed along each pixel in row and column directions. The color filter substrate is located opposite the TFT substrate and includes a common electrode.

In such a device, the gate electrode receives gate driving signals from the gate driver through the gate line and forms a channel on the semiconductor layer. The data signals from the data driver are thus applied to the source electrode through the data line. These signals finally arrive at each pixel electrode through the semiconductor layer and the drain electrode.

A conventional TFT-LCD will now be described with reference to the appended figures, in which FIG. 1 is a cross-sectional view of a device which uses amorphous silicon.

The LCD of this figure includes substrate 10; gate electrode 12 formed of conductive material on substrate 10; gate insulating layer 14 formed on gate electrode 12; amorphous silicon layer 16 formed on gate insulating layer 14; extrinsic semiconductor layer 16-1 formed on amorphous silicon layer 16, the center of which is etched away; and source and drain electrodes 17, 18 both of which are made of conductive material and formed on the extrinsic semiconductor layer 16-1.

In this conventional TFT-LCD, the field effect mobility of carrier electrons decreases, because amorphous silicon is used, which makes the on-current lower since the magnitude of the on-current is proportional to the field effect mobility.

FIG. 2 is a cross-sectional view of another conventional TFT-LCD using a minute crystalline structure. The TFT-LCD of FIG. 2, includes substrate 10, gate electrode 12 and gate insulating layer 14 formed as described above with respect to the TFT-LCD of FIG. 1. A microcrystalized silicon layer 26 is formed on gate insulating layer 14 and extrinsic semiconductor layer 16-1 is formed on microcrystalized silicon layer 26. The center of extrinsic semiconductor layer 16-1 has been etched away. Source and drain electrode 17, 18 made of conductive material are formed on extrinsic semiconductor layer 16-1.

In this TFT-LCD, the field effect mobility of carrier electrons increases, because microcrystalized silicon is used, which causes the TFT-LCD to have a higher off-current since the magnitude of the off-current is proportional to the field effect mobility.

SUMMARY OF THE INVENTION

In view of the above, it is an object of the present invention to provide a thin film transistor liquid crystal display which has a high field effect mobility permitting a high on-current, while maintaining a lower off-current.

To obtain this object, a TFT-LCD of this invention includes a microcrystallized silicon layer formed on the gate insulating layer and an amorphous silicon layer formed on the microcrystallized silicon layer. An extrinsic semiconductor layer is formed to contact both the amorphous silicon layer and the microcrystallized layer and source and drain electrodes are formed on the extrinsic semiconductor layer.

A method of manufacturing this TFT-LCD includes the steps of successively forming a gate electrode and a gate insulating layer on a substrate, forming a channel layer by successively depositing microcrystallized silicon and amorphous silicon and then etching both layers, depositing an extrinsic semiconductor layer on the amorphous silicon layer and forming source and drain electrodes by depositing conductive material on the extrinsic semiconductor layer and then etching both the conductive material and extrinsic semiconductor layer.

BRIEF DESCRIPTION OF THE DRAWINGS

The preferred embodiments of the present invention will now be described more specifically with reference to the attached drawings, wherein.

DETAILED DESCRIPTION OF THE PREFERRED EMBODIMENTS

Figure 1:
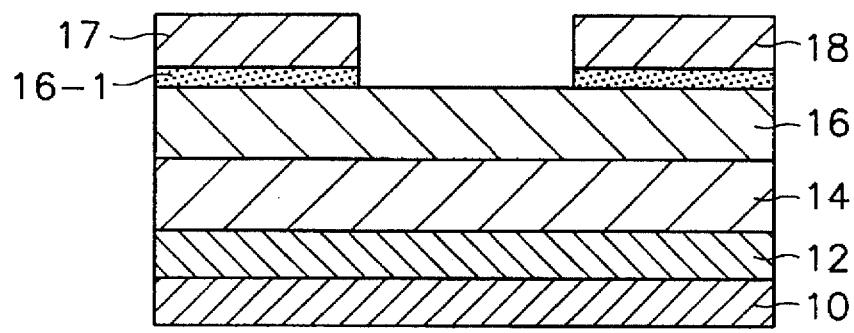
FIG. 1 is a cross-sectional view of a conventional TFT-LCD using amorphous silicon.
Figure 2:
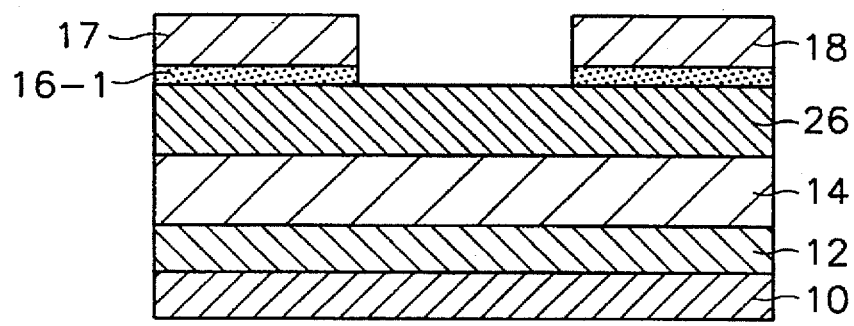
FIG. 2 is a cross-sectional view of another conventional TFT-LCD using microcrystallized silicon.
Figure 3:
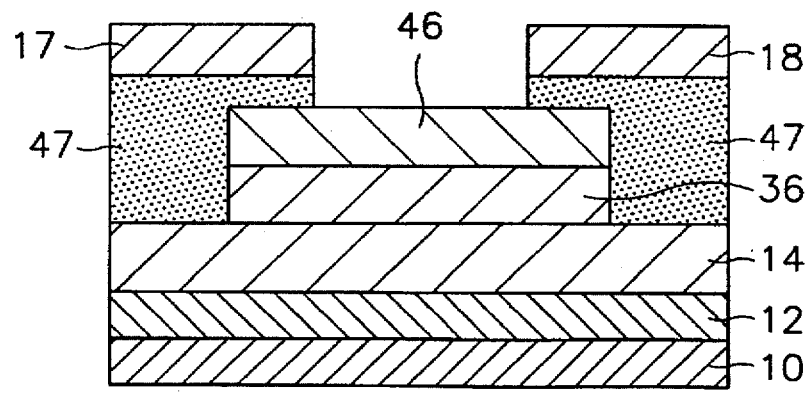
FIG. 3 is a cross-sectional view of a TFT-LCD according to a preferred embodiment of this invention.

A preferred embodiment of the present invention will now be described with reference to the accompanying drawings, in which FIG. 3 is a cross-sectional view of a TFT-LCD according to a preferred embodiment of this invention.

As shown in FIG. 3, a preferred embodiment of this inventing includes substrate 10, gate electrode 12 formed of a conductive material on substrate 10 and gate insulating layer 14 formed on gate electrode 12. The gate electrode may be anodized. A microcrystallized silicon layer (µC-Si:H) 36 and amorphous silicon layer 46 are formed on the gate insulating layer and patterned to serve as a channel layer. An extrinsic semiconductor layer 47 is formed to be in contact with both microcrystallized silicon layer 36 and amorphous silicon layer 46, and conductive material is deposited on extrinsic semiconductor layer 47 to form source electrode 17 and drain electrode 18.

Figure 4A:
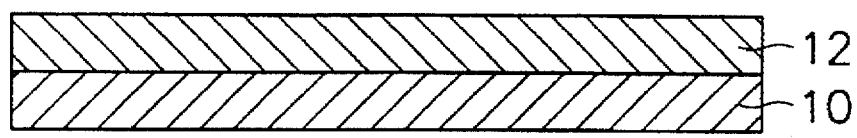
FIGS. 4A to 4F show the process sequence for fabricating the TFT-LCD according to the preferred embodiment of this invention.
Figure 4B:
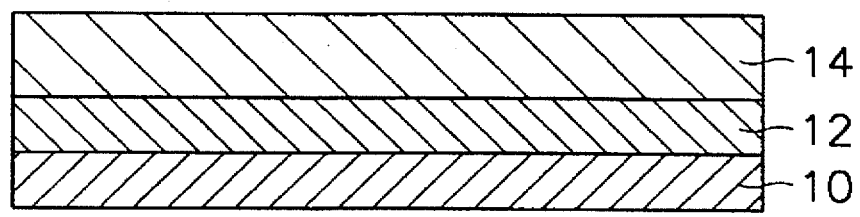
Figure 4C:
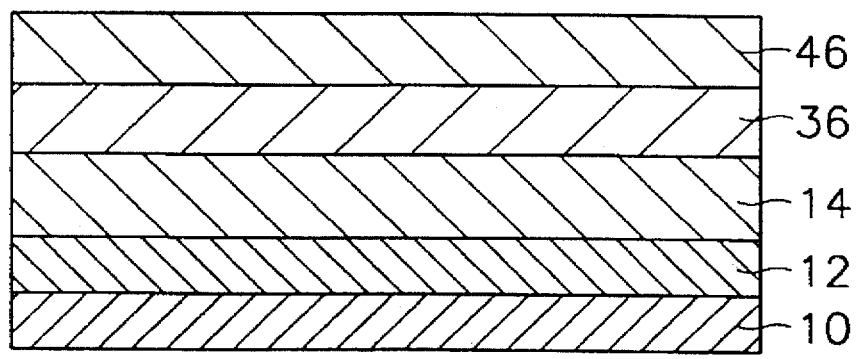

A process for forming the TFT-LCD according to the preferred embodiment of this invention will now be described with particular reference to FIGS. 4A–4F. As shown in FIG. 4A, the process is begun by forming gate electrode 12 made of conductive material, such as aluminum, on substrate 10. If desired, the gate electrode may be anodized. Next, as illustrated in FIG. 4B, gate insulating layer 14 made of an insulating material such as SiNx is deposited on gate electrode 12. Then, as illustrated in FIG. 4C, microcrystallized silicon layer (µC-Si:H) 36 and amorphous silicon layer 46, serving as a channel layer, are deposited on gate insulating layer 14.

In this step, microcrystallized silicon layer 36 is preferably produced using a hydrogen dilution method, and RF-PECVD is used as the coating method. The coating process should preferably be performed with RF power of above 300 W at 250° C.–350° C., and more preferably at 250° C., under the condition that $SiH_4:H_2$ is 15:1,000 ml. Pressure is preferably maintained in the range of 80 Pa–150 Pa, more preferably at 110 Pa.

The microcrystallized silicon layer is preferably deposited to a thickness of 300 Å to 700 Å, and more preferably 500 Å, while the amorphous silicon layer is preferably deposited to a thickness of 700 Å to 2,000 Å, and more preferably 1,500 Å.

Figure 4D:
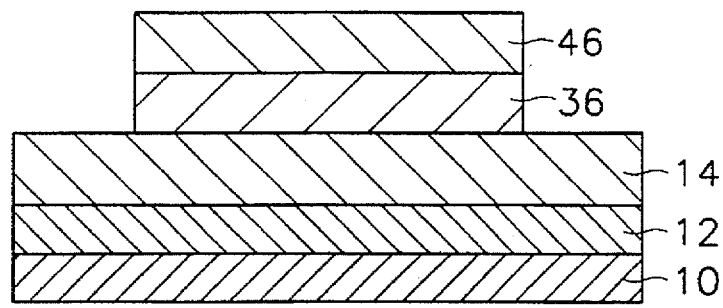
Figure 4E:
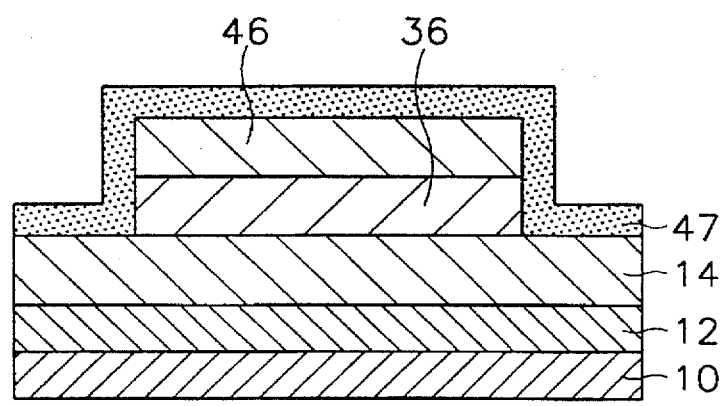

The amorphous silicon layer 46 and the microcrystallized silicon layer 36 are then etched as illustrated in FIG. 4D, and extrinsic semiconductor layer 47 is deposited on the entire surface, as illustrated in FIG. 4E.

Figure 4F:
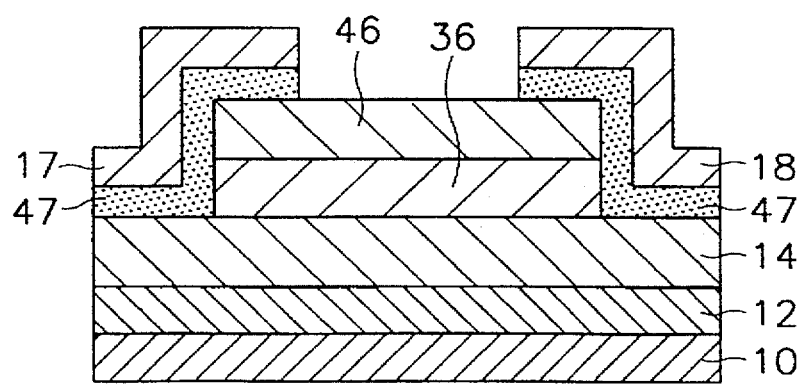

As illustrated in FIG. 4F, a conductive material, such as chromium, is then deposited on extrinsic semiconductor layer 47 and the conductive material and extrinsic semiconductor layer 47 are etched together to create source electrode 17 and drain electrode 18.

A TFT-LCD formed in this manner is capable of maintaining a lower off-current, while permitting a high on-current.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A thin film transistor liquid crystal display, comprising:
   a substrate;
   a gate electrode made of conductive material formed on the substrate;
   a gate insulating layer formed on the gate electrode;
   a microcrystallized silicon layer;
   an amorphous silicon layer;
   an extrinsic semiconductor layer formed on at least a portion of the amorphous silicon layer and in contact with at least a portion of said microcrystallized silicon layer, said extrinsic semiconductor layer having portions which are separated from each other; and
   a source electrode and a drain electrode made of conductive material, said source and drain electrodes being separated from each other and being formed on said extrinsic semiconductor layer.

2. A thin film transistor liquid crystal display of claim 1, wherein the microcrystallized silicon layer is formed on the gate insulating layer and the amorphous silicon layer is formed on the microcrystallized silicon layer.

3. A thin film transistor liquid crystal display of claim 2, further comprising an anodized film formed between the gate electrode and the gate insulating layer.

4. A thin film transistor liquid crystal display of claim 2, wherein the gate electrode is made of aluminum.

5. A thin film transistor liquid crystal display of claim 2, wherein the source and drain electrodes are made of chromium.

6. A thin film transistor liquid crystal display of claim 2, wherein a thickness of the microcrystallized silicon layer is 300 Å–700 Å.

7. A thin film transistor liquid crystal display of claim 2, wherein a thickness of the amorphous silicon layer is 700 Å–2000 Å.

* * * * *